:::

(12) United States Patent
Fedorov et al.

(10) Patent No.: US 8,710,625 B2
(45) Date of Patent: Apr. 29, 2014

(54) DEVICES INCLUDING COMPOSITE THERMAL CAPACITORS

(71) Applicant: Georgia Tech Research Corporation, Atlanta, GA (US)

(72) Inventors: Andrei G. Fedorov, Atlanta, GA (US); Craig Green, Atlanta, GA (US); Yogendra Joshi, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/719,478

(22) Filed: Dec. 19, 2012

(65) Prior Publication Data

US 2013/0187262 A1    Jul. 25, 2013

Related U.S. Application Data

(63) Continuation of application No. 13/066,998, filed on Apr. 29, 2011, now Pat. No. 8,378,453.

(51) Int. Cl.
*H01L 29/00* (2006.01)

(52) U.S. Cl.
USPC .................................. 257/532; 257/E27.048

(58) Field of Classification Search
USPC .......................................... 257/532, E27.048
See application file for complete search history.

(56) References Cited

U.S. PATENT DOCUMENTS

| | | | |
|---|---|---|---|
| 4,572,864 A | 2/1986 | Benson et al. | |
| 4,609,036 A | 9/1986 | Schrader | |
| 5,083,605 A | 1/1992 | Collings | |
| 5,202,150 A | 4/1993 | Benson et al. | |
| 5,272,491 A | 12/1993 | Asakawa et al. | |
| 5,578,841 A * | 11/1996 | Vasquez et al. | 257/220 |
| 5,711,155 A | 1/1998 | DeVilbiss et al. | |
| 5,722,482 A | 3/1998 | Buckley | |
| 5,804,297 A | 9/1998 | Colvin et al. | |
| 6,101,094 A | 8/2000 | Kermaani et al. | |
| 6,120,530 A | 9/2000 | Nuckols et al. | |
| 6,855,410 B2 | 2/2005 | Buckley | |
| 6,889,751 B1 * | 5/2005 | Lukas et al. | 165/10 |
| 7,223,816 B2 | 5/2007 | Handlin, Jr. et al. | |
| 7,788,941 B2 | 9/2010 | Campbell et al. | |
| 7,874,173 B2 * | 1/2011 | Yasuo | 62/259.2 |
| 8,129,224 B2 * | 3/2012 | Gurrum et al. | 438/122 |
| 2009/0288801 A1 | 11/2009 | Figus | |
| 2010/0019385 A1 | 1/2010 | Bartley et al. | |
| 2010/0052374 A1 * | 3/2010 | Bell et al. | 297/180.12 |
| 2010/0068444 A1 * | 3/2010 | Asplund et al. | 428/64.5 |

(Continued)

FOREIGN PATENT DOCUMENTS

FR    2 893 776 A1    5/2007

OTHER PUBLICATIONS

Chaparro, et al.; Understanding the Thermal Implications of Multicore Architectures; IEEE Transactions on Parallel and Distributed Systems, vol. 18, No. 8, Aug. 2007; pp. 1055-1065.

(Continued)

*Primary Examiner* — Ida M Soward
(74) *Attorney, Agent, or Firm* — Thomas | Horstemeyer, LLP

(57) ABSTRACT

Embodiments of the present disclosure include devices or systems that include a composite thermal capacitor disposed in thermal communication with a hot spot of the device, methods of dissipating thermal energy in a device or system, and the like.

13 Claims, 12 Drawing Sheets

(56) References Cited

U.S. PATENT DOCUMENTS

| | | | |
|---|---|---|---|
| 2011/0293480 A1* | 12/2011 | Mueller | 422/83 |
| 2012/0037337 A1 | 2/2012 | Zillmer | |
| 2012/0048322 A1* | 3/2012 | Ghoshal et al. | 136/201 |
| 2012/0206880 A1* | 8/2012 | Andres et al. | 361/700 |
| 2012/0258337 A1* | 10/2012 | Wang | 429/50 |

OTHER PUBLICATIONS

Topol, et al.; Three-Dimensional Integrated Circuits; IBM J. Res. & Dev. vol. 50, No. 4/5; Jul./Sep. 2006; pp. 491-506.

Fraisse, et al.; Study of a Thermoelement's Behaviour Through a Modelling Based on Electrical Analogy; International Journal of Heat and Mass Transfer; 53; (2010); pp. 3503-3512.

Kim, et al.; Thermal Characterization of Interlayer Microfluidic Cooling of Three-Dimensional Integrated Circuits with Nonuniform Heat Flux; Journal of Heat Transfer; Apr. 2010; vol. 132; pp. 041009-1-041009-9.

Borkar; Thousand Core Chips—A Technology Perspective; DAC 2007, Jun. 4-8, 2007, San Diego, California, USA pp. 746-749.

Green, et al.; Thermal Capacitance Matching in 3D Many-Core Architectures; 27th IEEE Semi-Term Symposium; pp. 110-115.

Shakouri; Nanoscale Thermal Transport and Microrefrigerators on a Chip; Proceedings of the IEEE; vol. 94, No. 8; Aug. 2006; pp. 16131638.

Cohen; On-Chip Hot Spot Remediation with Minaturized Thermoelectric Coolers; Microgravity Sci. Technol; 2009; 21 (Suppl 1): pp. 5351-5359.

Yavatkar, et al.; Platform Wide Innovations to Overcome Thermal Challenges; Microelectronics Journal 39 (2008); pp. 930-941.

Zhou; et al.; Thermal-Aware Task Scheduling for 3D Multicore Processors; IEEE Transactions on Parallel and Distributed Systems; vol. 21, No. 1, Jan. 2010; pp. 60-71.

Zeng, et al.; Thermal Conductivity Enhancement of MWNTs on the Pani/Tetradecanol Form-Stable PCM; Journal of Thermal Analysis and Calorimetry; vol. 91; (2008) 2, pp. 443-446.

Healy, et al.; Thermal Optimization in Multi-Granularity Multi-Core Floorplanning; 978-1-4244-2749-9/09 Copyright 2009; IEEE; pp. 43-48.

Patterson; Latency Lags Bandwith; Communications of the ACM; Oct. 2004/vol. 47, No. 10; pp. 71-75.

Tang, et al.; A 2-D Numerical Study of Microscale Phase Change Material Thermal Storage for GaN Transistor Thermal Management; 27th IEEE Semi-Therm Symposium; pp. 27-34.

Narayanan, et al.; Gas-Assisted Then-Film Evaporation From Confined Spaces for Dissipation of High Heat Fluxes; Nanoscale and Microscale Thermophysical Engineering; 13: 2009; pp. 30-53.

Jedec Publication No. 122E; Failure Mechanisms and Models for Semiconductor Devices; Mar. 2009; Nov. 2010; 105 pages.

Green, et al.; Fluid-to-Fluid Spot-to-Spreader (F2/S2) Hybrid Heat Sink for Integrated Chip-Level and Hot Spot-Level Thermal Management; Journal of Electronic Packaging; Jun. 2009; vol. 131; pp. 025002-1-025002-10.

Huang, et al.; Exploring the Thermal Impace on Manycore Processor Performance; 26th IEEE Semi-Therm Symposium; 7 pages.

Sahu, et al.; Experimental Investigation of Hotspot Removal Using Superlattice Cooler; 978-1-4244-5343-6/10; copyright 2010; IEEE.

Losert, et al.; Evolution of Dendritic Patterns During Alloy Solidification: Onset of the Initial Instability; Proc. Natl. Acad. Sci. USA; vol. 95; Jan. 1998; pp. 431-438.

Xu; et al.; Enhancement of Thermal Interface Materials with Carbon Nanotube Arrays; International Journal of Heat and Mass Transfer; 49; (2006); pp. 1658-1666.

Kish; End of Moore's Law: Thermal (noise) Death of Integration in Micro and Nano Electronics; Physics Letters A; 305; (2002); pp. 144-149.

Cohen, et al.; Direct Liquid Cooling of High Flux Micro and Nano Electronic Components; Proceedings of the IEEE; vol. 94, No. 8, Aug. 2006; pp. 15491570.

Bonner, III; Die Level Thermal Storage for Improved Cooling of Pulsed Devices; 27th IEEE Semi-Therm Symposium; pp. 193-198.

Hill, et al.; Amdahl's Law in the Multicore Era; IEEE Computer Society; Jul. 2008; pp. 33-38.

Emma, et al.; Is 3D Chip Technology the Next Growth Engine for Performance Improvement; IBM J. Res. & Dev.; vol. 52, No. 6; Nov. 2008; pp. 541-552.

* cited by examiner

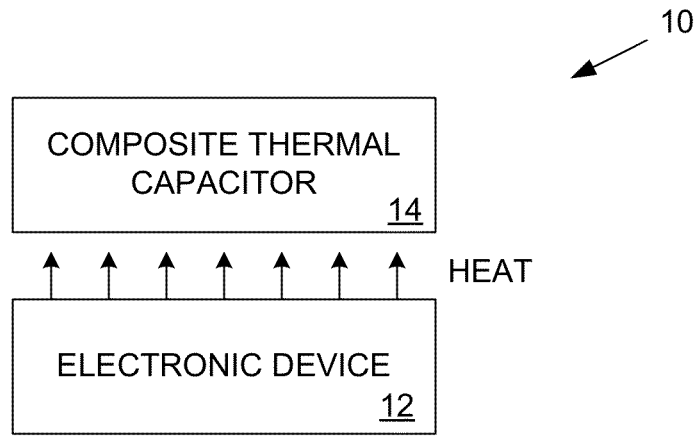
FIG. 1.1
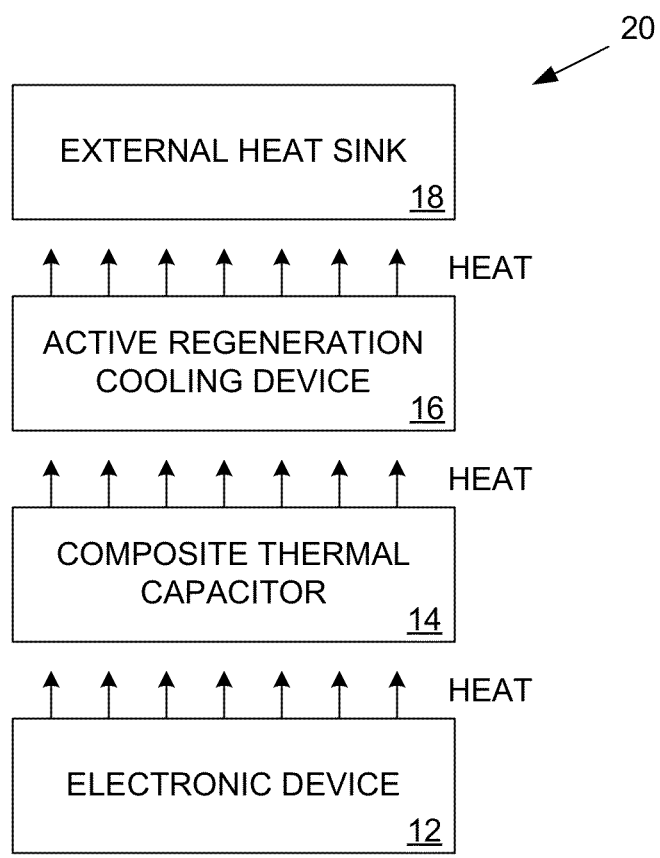
FIG. 1.2

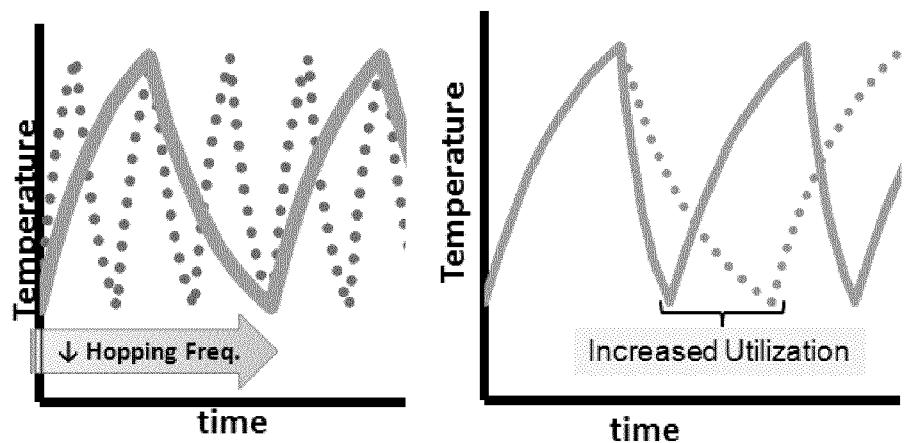
FIG. 2.1A and B
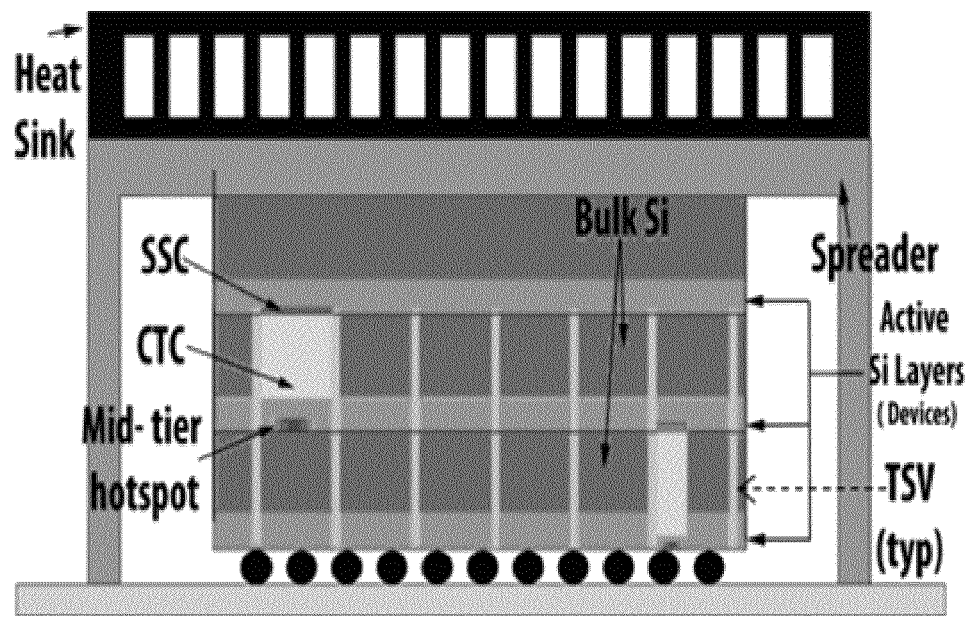
FIG. 2.2

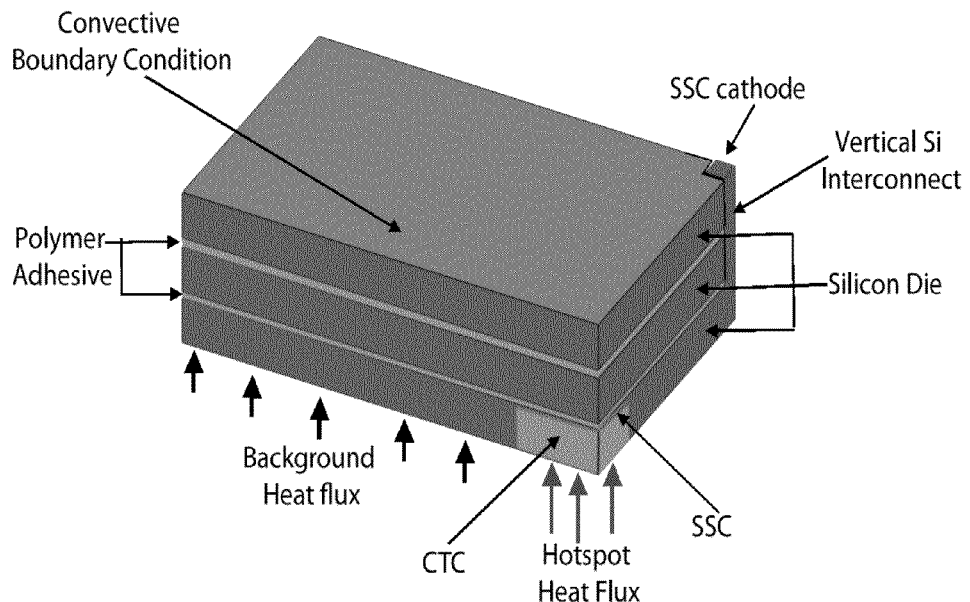
FIG. 2.3
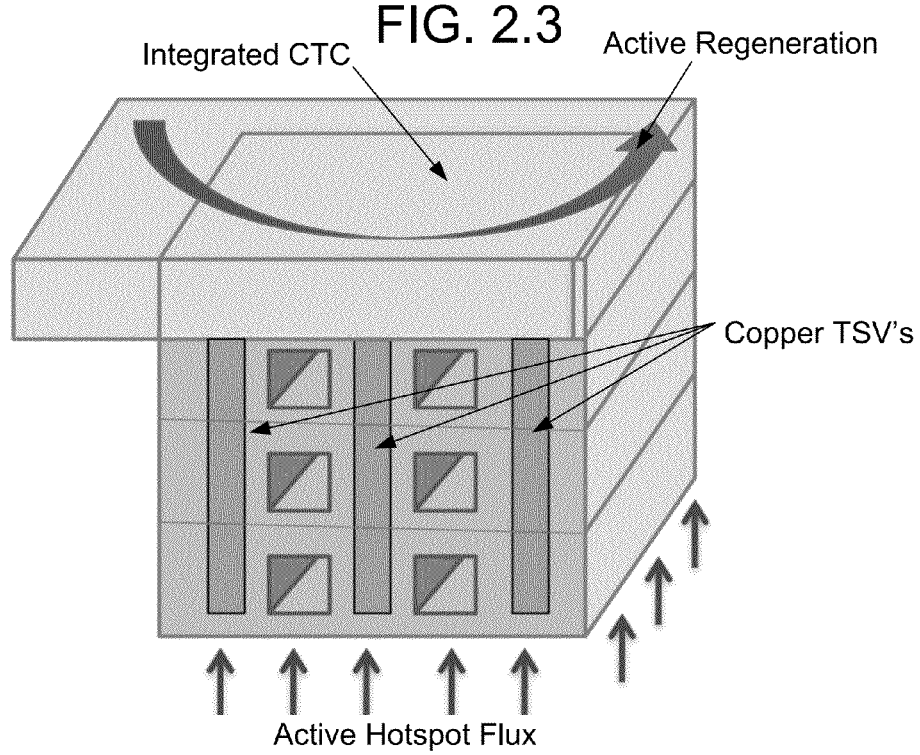
FIG. 2.4

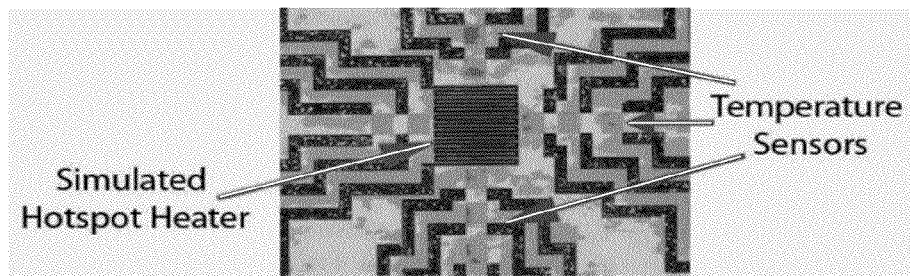
FIG. 2.5A
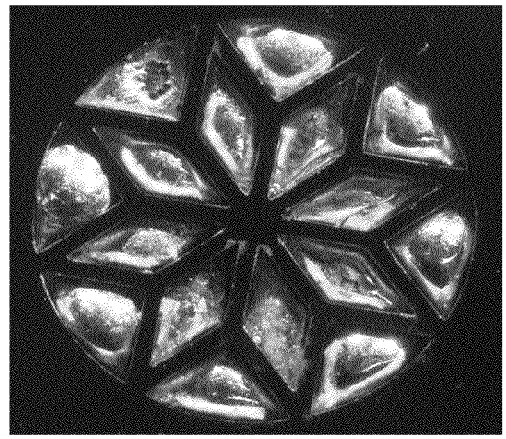
FIG. 2.5B

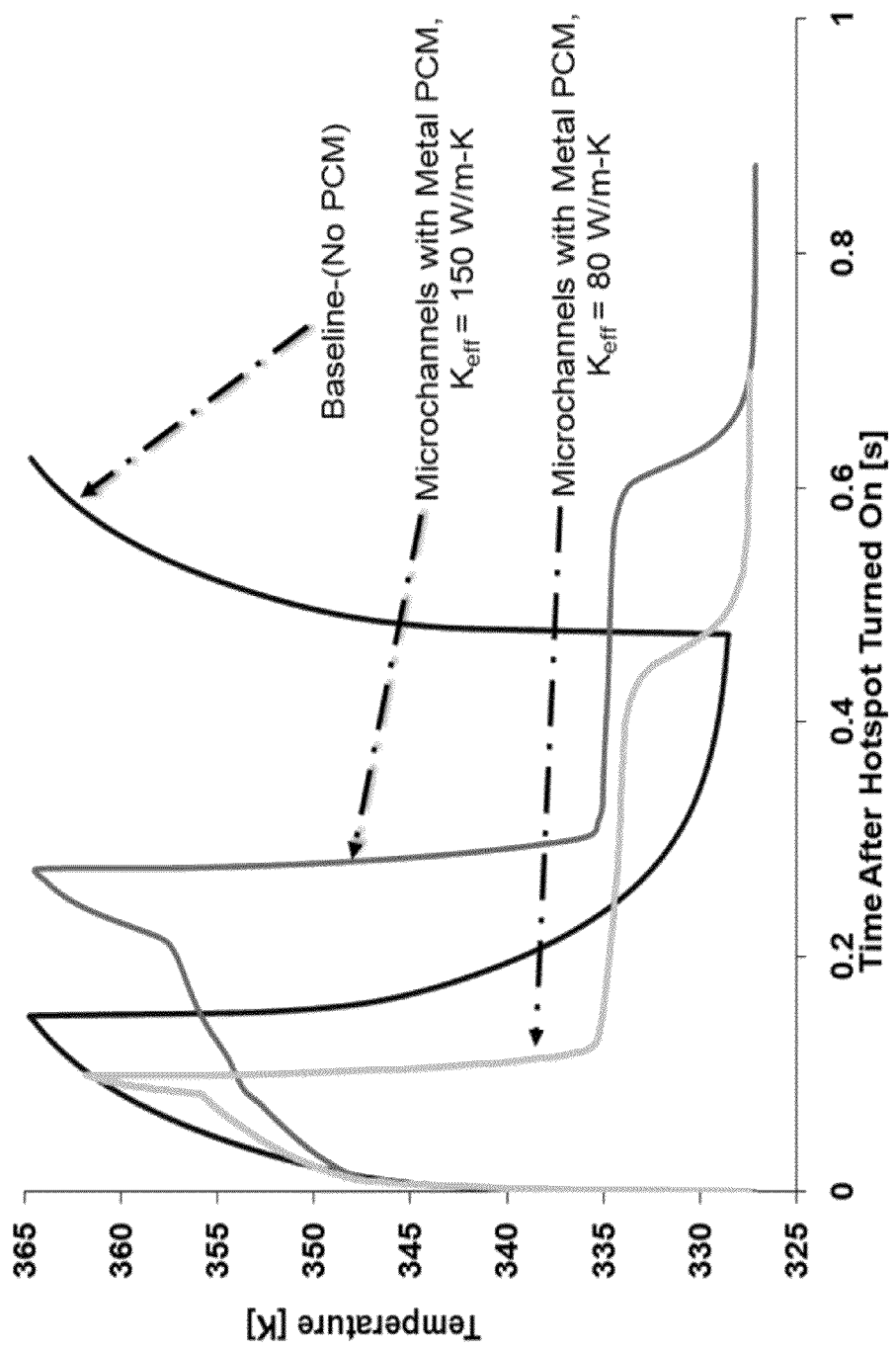
FIG. 2.6

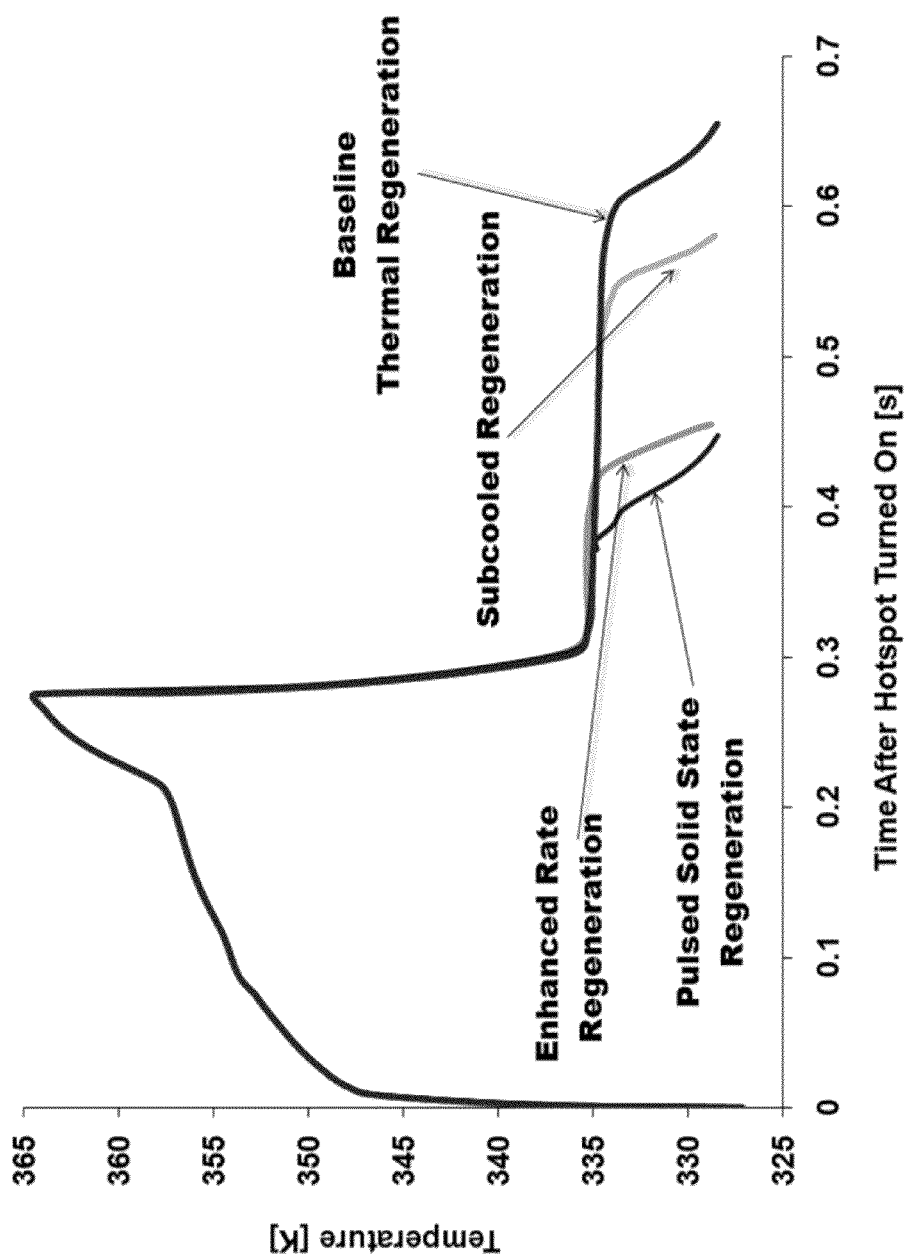
FIG. 2.7

| Regeneration Method | h [kW/m²-K] | $T_\infty$ [K] | | Utilization [%] |
|---|---|---|---|---|
| Baseline Thermal | 22 | 310 | Silicon Only | 31 |
| Subcooled | 22 | 300 | PCM | 40.5 |
| Enhanced Rate | 100 | 310 | PCM | 45 |
| Pulsed Solid State | 22 | 310 | PCM | 58 |
| | | | PCM | 59 |

FIG. 2.8

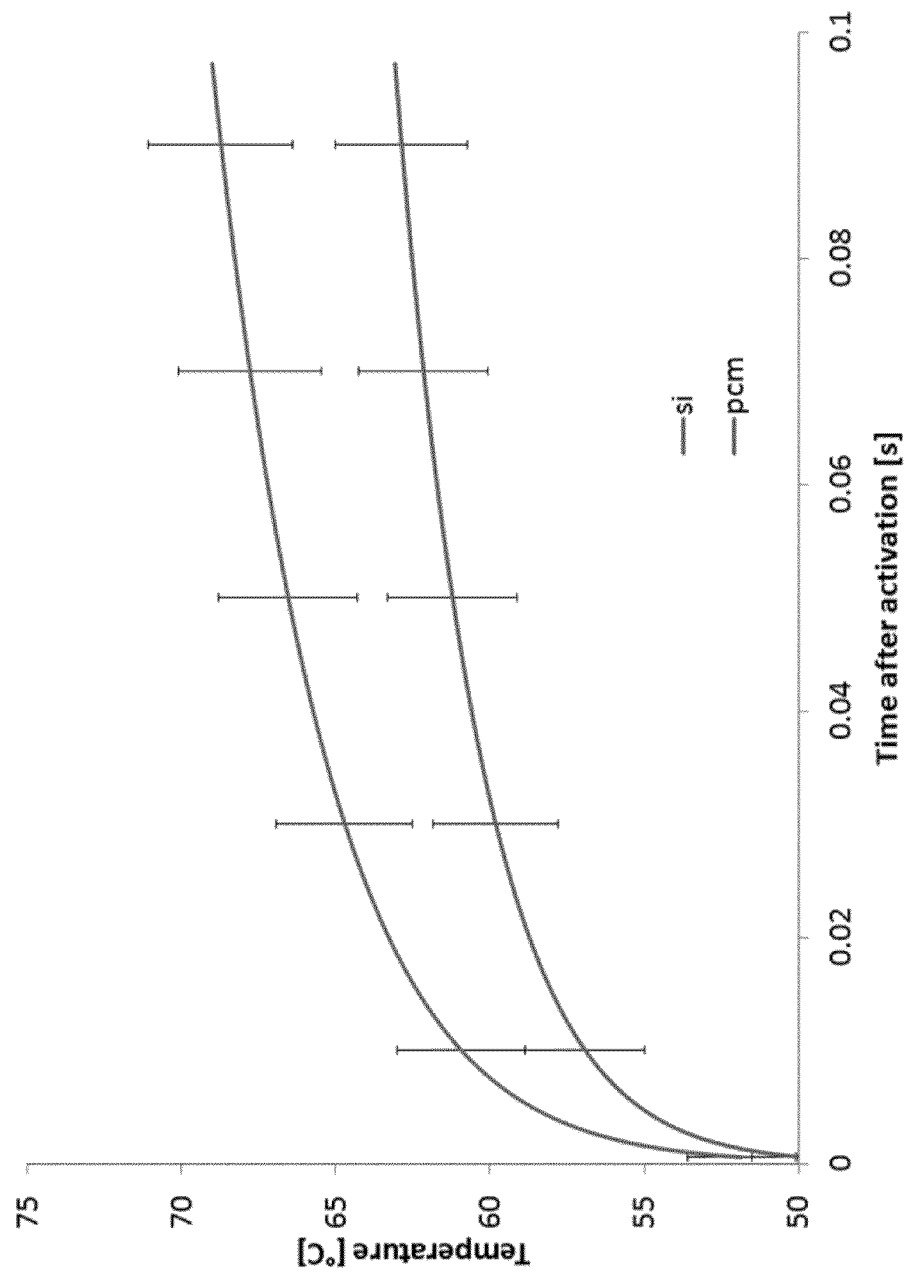
FIG. 2.9A

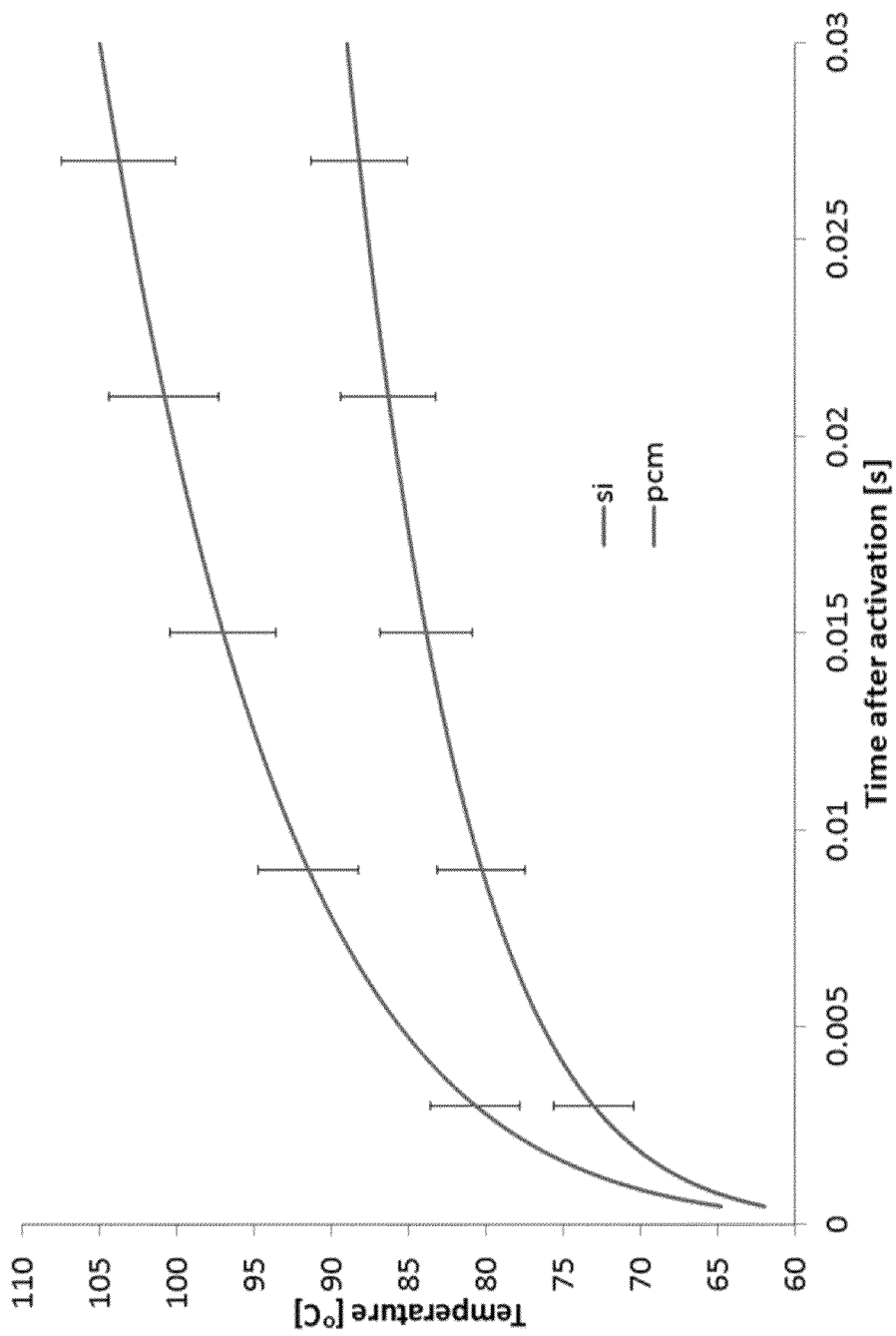
FIG. 2.9B

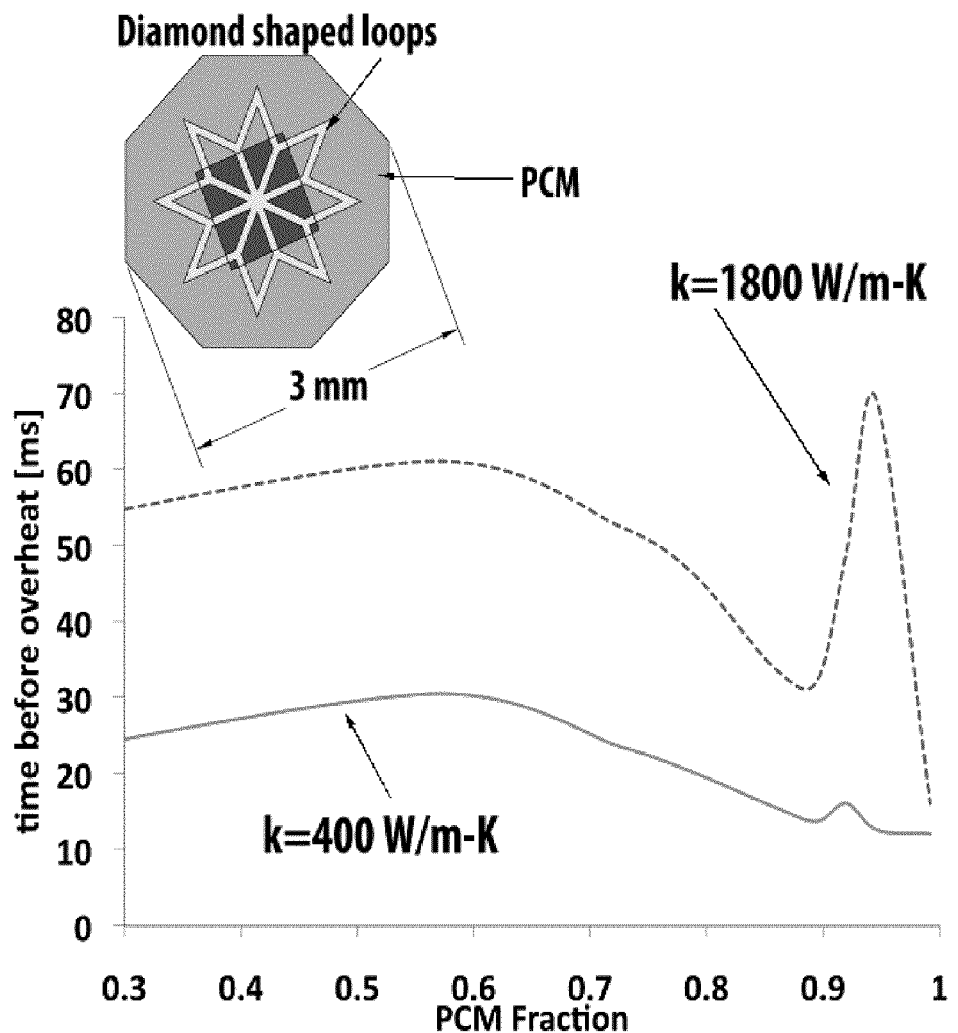
FIG. 2.10

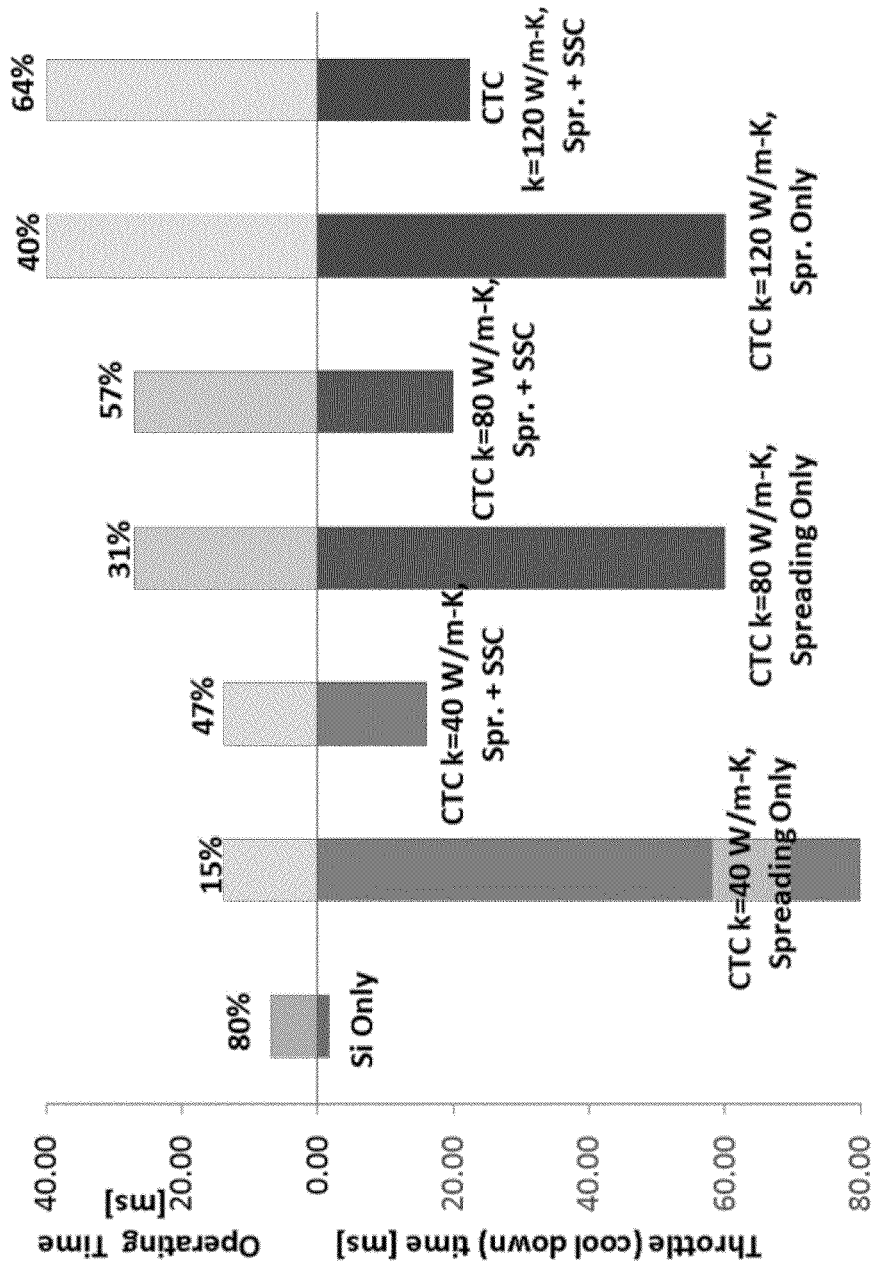
FIG. 2.11A

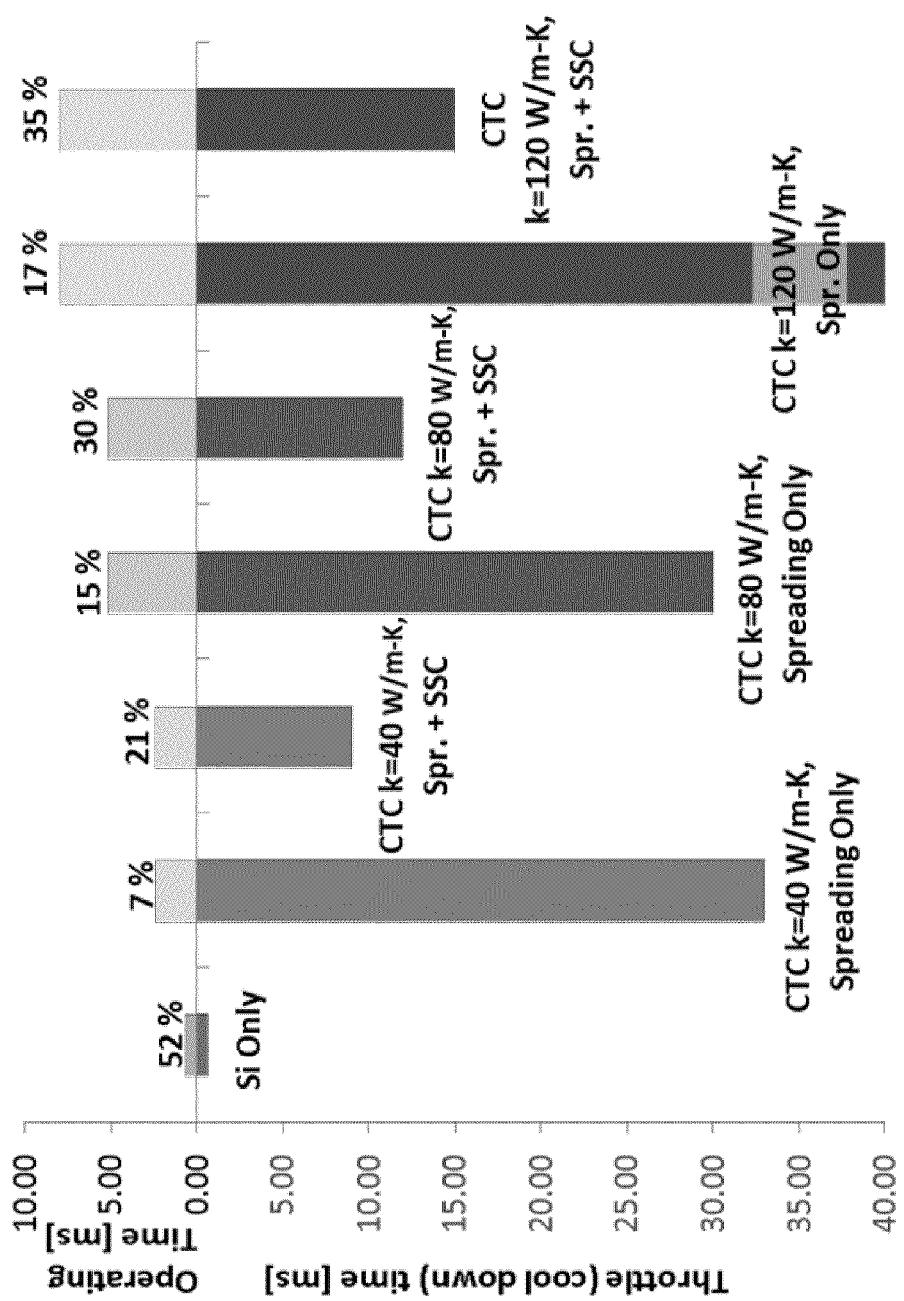
FIG. 2.11B

DEVICES INCLUDING COMPOSITE THERMAL CAPACITORS

CROSS-REFERENCE TO RELATED APPLICATION

This application is a continuation application of allowed copending U.S. utility application entitled, "Devices Including Composite Thermal Capacitors," having Ser. No. 13/066,998, filed Apr. 29, 2011, now U.S. Pat. No. 8,378,453 issued Feb. 19, 2013 which is entirely incorporated herein by reference.

FEDERAL SPONSORSHIP

This invention was made with Government support under Contract/Grant No. HR0011-10-3-0002, awarded by DARPA. The Government has certain rights in this invention.

BACKGROUND

The exponential growth in the number of on chip transistors so reliably predicted by Moore's Law has proven to be a powerful driver for increases in computing performance over the past 40 years, although limitations associated with wire delay, power consumption, and heat generation have recently become significant challenges to traditional transistor scaling. The desire to maintain the historic rate of advancement in the industry, while avoiding the roadblocks associated with power consumption and wire delay have led to the consideration of several disruptive design strategies for next generation devices including many core processors and 3D vertical integration.

Pollack's and Amdahl's scaling laws indicate that for power-constrained chip designs, architectures that implement many simple, low power cores should maximize the system's overall performance-per-W, as long as the code is massively parallelizable. To avoid limitations in computation speed due to the serial portions of the code, asymmetric core architectures can be implemented where a few higher power serial cores augment the performance of the low power cores to provide additional throughput. Architectures that vertically integrate the cores in a 3D multi-tier package allow for a number of additional design advantages, including shorter wire lengths, increased packaging density, and heterogeneous technology integration that translate into a range of potential performance benefits such as decreases in noise, capacitance, and power consumption.

In a many-core system, the thermal profile across the chip can be leveled by actively migrating computations from hotter to cooler areas of the chip, reducing the problem of localized hotspots that have become problematic in modern architectures. While this Dynamic Core Migration (DCM) scheme can mitigate hotspots for most cores, serial cores with their potentially higher power densities, larger size, and smaller number may still experience hotspots. To compensate for the higher power densities the serial cores will either experience more throttling events during an intra-migration time slice, higher migration frequencies, or a dedicated local hotspot cooling solution would be required to handle the additional thermal overhead.

There is a significant amount of research in the area of hotspot cooling. However these solutions add complexity to the overall system, and may become difficult to implement in a 3D stack where both inter- and intra-layer fluidic routing would be required. In DCM schemes, there is parasitic computational cost associated with each throttling event that can become significant over time when the cycling is too rapid. Furthermore, rapid thermal cycling can lead to reduced lifetime reliability for the chip. To minimize the performance losses associated with these gating and throttling events, an optimized system should be designed that can operate for longer periods without requiring an idle for cool-down, and have as short of an idle time as possible.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

The patent or application file contains at least one drawing executed in color. Copies of this patent or patent application publication with color drawing(s) will be provided by the Office upon request and payment of the necessary fee.

FIG. 1.1 illustrates an embodiment of the present disclosure.

FIG. 1.2 illustrates another embodiment of the present disclosure.

FIG. 2.1A illustrates the impact of increased thermal capacitance on core hopping frequency and FIG. 2.2B illustrates the impact of regenerative cooling on device utilization.

FIG. 2.2 illustrates a schematic of CTC integration in a 3D chip stack.

FIG. 2.3 illustrates a schematic of 3D computational domain and boundary conditions.

FIG. 2.4 illustrates a schematic of an implementation where the CTC is spatially separated from the electronic device containing the hotspot.

FIG. 2.5A illustrates an optical micrograph of a test structure that simulates the hotspot heater in demonstrating the utility of CTC cooling.

FIG. 2.5B illustrates an optical micrograph of a CTC embodiment.

FIG. 2.6 illustrates the impact of phase change materials with different effective thermal conductivites (CTC devices) on transient (heating and cooling) response of the device shown in FIG. 2.4

FIG. 2.7 illustrates the impact of different CTC regeneration schemes on cooldown dynamics for CTC implementation shown in FIG. 2.4

FIG. 2.8 illustrates a summary of the achieveable cooling utilization factors (fraction of time when the hot spot is ON to the total CTC cycle time, including time required for CTC regeneration) for a CTC with effective thermal conductivity of 150 W/m-K and different regeneration schemes, for the device shown in FIG. 2.4

FIG. 2.9A illustrates the experimentally observed temperature histories of dissipating 45 W/cm$^2$ heat flux from a pulsed hotspot with CTC and without CTC (marked Si), demonstrating the capability of CTC to significantly decrease the hot spot temperature and to increase the time before the critical temperature (e.g., 90° C. for electronic devices) is reached.

FIG. 2.9B illustrates the experimentally observed temperature histories of dissipating 133 W/cm$^2$ heat flux from a pulsed hotspot with CTC and without CTC (marked Si), demonstrating the capability of CTC to significantly decrease the hot spot temperature and to increase the time before the critical temperature (e.g., 90° C. for electronic devices) is reached.

FIG. 2.10 illustrates a time-on-a-core before reaching a 90° C. threshold for different CTC layout and material properties (for quantitative comparison, a baseline of Si only layer yields 3 ms time of operation before reaching a 90° C. threshold).

FIG. 2.11 illustrates the results of 3D numerical simulations for CTC performance with and without SSC regeneration: (A) 500 W/cm$^2$ hotspot heat flux (B) 1 kW/cm$^2$.

SUMMARY

Embodiments of the present disclosure include devices or systems that include a composite thermal capacitor disposed in thermal communication with a hot spot of the device, methods of dissipating thermal energy in a device or system, and the like.

An embodiment of a device, among others, includes: an electronic device having at least one hot spot, a composite thermal capacitor disposed in thermal communication with the hot spot of the electronic device, wherein the composite thermal capacitor includes a phase change material, wherein the heat from the hot spot is stored by the phase change material.

DETAILED DESCRIPTION

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of physics, thermodynamics, heat transfer, chemistry, material science, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in atmosphere. Standard temperature and pressure are defined as 25° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

As used herein, the term "adjacent" refers to the relative position of one or more features or structure, where such relative position can refer to being near or adjoining. Adjacent structures can be spaced apart from one another or can be in actual contact with one another. In some instances, adjacent structures can be coupled to one another or can be formed integrally with one another.

Discussion

Embodiments of the present disclosure include devices or systems that include a composite thermal capacitor disposed in thermal communication with a hot spot of the device, methods of dissipating thermal energy in a device or system, and the like. The composite thermal capacitor is in thermal communication (e.g., exchange heat) with one or more hot spots in the device. In an embodiment, the composite thermal capacitor structure functions to remove, dissipate, store and/or spread heat, from a hot spot in the device, which results in a large increase in the local thermal capacitance and allows the device to operate for longer periods of time. In an embodiment, the composite thermal capacitor can temporarily store thermal energy from hard-to-access areas of a two-dimensional core architecture or a three-dimensional stack core architecture. The composite thermal capacitor can be used to maximize thermal capacitance in high power areas, minimizing hopping and/or throttling frequency in dynamic core migration strategies. These improvements can result in the reduction of the parasitic computational overhead associated with dynamic core migration strategies. Asymmetric cooling and/or regeneration of the composite thermal capacitor can be used to maximize overall core utilization (the fraction of time during a defined period where an electronic device is able to actively function, e.g., perform computations) in dynamic core migration strategies. Because the time response of the composite thermal capacitor (CTC) matches an electronic device's thermal capacitance time scale due to its intrinsic dynamics of power dissipation, it can "homogenize" the thermal time scales of electronic devices with very different power dissipation profiles. With time scales levelized across the chip, thread and workload scheduling becomes significantly simplified for dynamically operated devices.

FIG. 1.1 illustrates an embodiment of a device 10 of the present disclosure, while FIG. 1.2 illustrates another embodiment of the device 20 of the present disclosure. The device 10 includes an electronic device 12 having at least one hot spot and a composite thermal capacitor 14 disposed in thermal communication with the hot spot of the electronic device 12. The composite thermal capacitor 14 includes a phase change material, where the thermal energy from the hot spot is stored by the phase change material.

The device 20 in FIG. 1.2 is similar to device 10 in FIG. 1.1 but also includes an active regeneration cooling device 16 in thermal communication with the composite thermal capacitor 14. An external heat sink 18 is in thermal communication with the active regeneration cooling device 16. The electronic device 12 includes at least one hot spot and the composite thermal capacitor 14 is in thermal communication with the electronic device 12 to store thermal energy from the hot spot. As in device 10 in FIG. 1.1, the composite thermal capacitor 14 includes a phase change material, where the thermal energy from the hot spot is stored by the phase change material. The active regeneration cooling device 16 dissipates thermal energy from the composite thermal capacitor 14. The external heat sink 18 dissipates thermal energy from the active regeneration cooling device 16. Thus, thermal energy can be removed from the hot spot through the composite thermal capacitor 14, to the active regeneration cooling device 16, and to the external heat sink 18.

In device 10 and 20, the electronic device 12 and the composite thermal capacitor 14 can be adjacent one another. In an embodiment, the electronic device 12 and the composite thermal capacitor 14 can be in direct contact with one another. In another embodiment, the electronic device 12 and the composite thermal capacitor 14 can be indirectly connected using a structure such as a network of high conductivity thermal vias or a slab heat spreader, a heat pipe, a fluidic loop, solid state heat pump, or any other intermediate cooling/heat transfer devices or a combination thereof.

In device 20, the composite thermal capacitor 14 and the active regeneration cooling device 16 can be adjacent one another. In an embodiment, the composite thermal capacitor 14 and the active regeneration cooling device 16 can be in direct contact with one another. In another embodiment, the composite thermal capacitor 14 and the active regeneration cooling device 16 can be indirectly connected using a structure such as a network of high conductivity thermal vias or a slab heat spreader, a heat pipe, a fluidic loop, solid state heat pump, or any other intermediate cooling/heat transfer devices or a combination thereof.

In device 20, the active regeneration cooling device 16 and the external heat sink 18 can be adjacent one another. In an embodiment, the active regeneration cooling device 16 and the external heat sink 18 can be in direct contact with one another. In another embodiment, the active regeneration cooling device 16 and the external heat sink 18 can be indirectly connected using a structure such as a network of high conductivity thermal vias or a slab heat spreader, a heat pipe, a fluidic loop, solid state heat pump, or any other intermediate cooling/heat transfer devices or a combination thereof.

In an embodiment, the device 10 can include a computer chip, an electronic component, a display, an engine, a fuel cell or other power generation device (e.g., solar cell), a chemical reactor, a light source, and the like. In particular, the device 10 can include a microprocessor, Application Specific Integrated Circuits (ASICs), System-on-a-Chip (SoC), a microelectronic chip, a optoelectronic chip, a hybrid optoelectronic/microelectronic chip, a memory device, analog or radio frequency (RF) micro devices, System on a Package (SOP), biochips, medical or electronic imaging devices, and on chip power management devices such as AC/DC converters.

In an embodiment, the electronic device 12 can be a portion or feature of the device 10. In an embodiment, the electronic device includes a two-dimensional semiconductor chip stack, a three-dimensional semiconductor chip stack, a multi-core semiconductor chip, Application Specific Integrated Circuits (ASICs), System-on-a-Chip (SoC), a microelectronic chip, a memory device, a optoelectronic chip, a hybrid optoelectronic/microelectronic chip, analog or radio frequency (RF) micro devices, System on a Package (SOP), biochips, medical or electronic imaging devices, and on chip power management devices such as AC/DC converters.

Phase change materials have unique thermophysical properties in that they can absorb thermal energy without temperature rise during the melting process and are capable of storing and releasing large amounts of thermal energy. Once a state change occurs (e.g., solid changes to a liquid), heat is released or absorbed. Thermal energy from the hot spot can be thermally communicated with the phase change material by placing the phase change material adjacent the hot spot in the electronic device. The thermal energy of the phase change material can be thermally communicated to a fluid or air or to another structure in thermal communication with the composite thermal capacitor.

The phase change material can be a solid-to-solid, a solid-to-liquid, a solid-to-gas, or a liquid-to-gas, phase change material. The types of phase change material can include materials that can undergo any of solid-to-solid, a solid-to-liquid, a solid-to-gas, or a liquid-to-gas, phase changes. In an embodiment, the phase change material is a reversible phase change material. In an embodiment, the phase change material can be organic, inorganic, a eutectic alloy, an alloy, or a combination thereof. The phase change material can include indium (e.g., indium acetate is a precursor material), tin (e.g., tin acetate is a precursor material), lead (e.g., lead acetate is a precursor material), bismuth (e.g., bismuth acetate is a precursor material), gold, silver, salt (NaCl, etc), paraffin wax, and other organic materials can also be used. Eutectic alloys that can be used include Ag (silver), Al (aluminum), Au (gold), Bi (bismuth), Cu (copper), In (indium), Ni (nickel), Pb (lead), Sb (antimony), Sn (tin), Zn (zinc), Cd (cadmium), (Ga) Gallium and other elements. Alloys that can be used include a binary, ternary, or other higher order alloys of the elements that can from alloys. Solid-to-solid phase change materials can include polymeric solids with multiple defined crystalline or amorphous solid states. The phase change materials can be modified with chemical components that would improve their wetting characteristics to effectively fill the cavity of the composite thermal capacitance.

In an embodiment, the composite thermal capacitor 14 including the phase change material can have a height of about 10 nm to 1 cm or about 5 µm to 5 mm, a length of about 5 µm to 10 cm or about 100 µm to 1 mm, and a width of about 5 µm to 10 cm or about 100 µm to 1 mm.

In an embodiment, the composite thermal capacitor can also include a high thermal conductivity material. The high thermal conductivity material can be included to assist in the heat dissipation from the phase change material to the fluid or air or another structure in thermal communication with the composite thermal capacitor. Also, the high thermal conductivity material can be included to promote lateral and vertical (i.e., across the PCM layer) heat spreading within the composite thermal capacitor for improved utilization of the phase-change material for heat storage. In an embodiment, the high thermal conductivity material can be mixed with the phase change material and/or be disposed in an area (second area) distinct from the phase change material (first area) but in thermal communication with the phase change material. The first area including the phase change material can have a cross-section such as a polygonal cross-section, a circular cross-section, substantially circular cross-section, annular cross section, and a combination thereof. The second area including the high thermal conductivity material is the area on the outside or inside boundary of the first area. The areas are designed to efficiently thermally communicate heat energy from the phase change material to the high thermal conductivity material to a material or structure (See FIG. 1.2, an active regeneration cooling device) in thermal communication with the composite thermal capacitor.

In an embodiment, the high thermal conductivity material can include copper, silver, gold, aluminum, graphitized carbon, silicon, diamond, carbon nanotubes, graphene or a combination thereof.

In an embodiment, the composite thermal capacitor 14 including the phase change material and the high thermal conductivity material can have a height of about 10 nm to 1 cm or about 1 μm to 1 mm, and a width of about 1 μm to 10 cm or about 100 μm to 1 mm.

In an embodiment, the ratio of the phase change material to the high thermal conductivity material in the composite thermal capacitor is about 1:100 to 1;1.

In an embodiment, the composite thermal capacitor is in thermal communication with the hot spot of the electronic device using one or more through-silicon vias. The vias can be made of materials such as copper, silver, gold, aluminum, graphitized carbon, diamond, carbon nanotube, graphene, and a combination thereof. The vias can have a height of about 10 nm to 2 cm or about 5 μm to 5 mm a length of about 5 nm to 1 mm or about 1 μm to 100 μm, and a width of about 5 nm to 1 mm or about 1 μm to 100 μM.

In an embodiment, the active regeneration cooling device removes thermal energy from the composite thermal capacitor. In an embodiment, the active regeneration cooling device can include a fluidic cooling device, such as an array of jets, fluidic channels with or without surface enhancements such plates, fins, pins, wings or dimples, spray coolers, pool boiling or evaporation devices and combinations thereof. In an embodiment, the active regeneration cooling device can include a solid state cooling device such as a thin film thermoelectric, superlattice, bulk thermoelectric, or thermionic coolers, and a combination thereof.

In an embodiment, the external heat sink removes thermal energy from the active regeneration cooling device. In another embodiment, the external heat sink removes thermal energy from the composite thermal capacitor. The external heat sink can have various shapes (e.g., a polygonal cross-section) and can included fins, pin-fin arrays, or other surfaces extending from the base of the external heat sink to increase the surface area of the heat sink. The external heat sink can be made of solid or porous materials (preferably with high thermal conductivity) such as, but not limited to, copper, aluminum, silicon, diamond, steel, carbon, different polymers, or composite materials, and combinations thereof.

EXAMPLE

Brief Introduction

While 3D stacked multi-processor technology offers the potential for significant computing advantages, these architectures also face with the significant challenge of small, localized hotspots with very large power dissipation due to the placement of asymmetric cores, heterogeneous devices and performance driven layouts. In this Example, a new thermal management solution is proposed that seeks to maximize the performance of microprocessors with dynamically managed power profiles. To mitigate the non-uniformities in chip temperature profiles resulting from the dynamic power maps, phase change materials (PCMs) with an embedded heat spreader network are strategically positioned near localized hotspots, resulting in a large increase in the local thermal capacitance in these problematic areas. We show that this results in an up-to-twenty-fold increase in the time that a thermally constrained core can operate before a power gating or core migration event is required.

Coupled to the PCMs are solid state coolers (SSCs) that serve as a means for fast regeneration of the PCMs during the cool down periods associated with throttling events. Using this combined PCM/SSC approach allows for devices that operate with desirable combination of low throttling frequency and large overall core duty cycles, thus maximizing computational throughput.

Discussion

In order to address the unique challenges associated with thermal non-uniformities in 3D many-core architectures, we propose a solution that is a departure from the traditional approach of bringing a specialized liquid cooling device to the hotspot to locally enhance heat transfer. Instead of attempting to increase the heat transfer coefficients in the hard-to-access internal layers of a 3D stack, the design proposed in this work seeks to locally increase the thermal capacitance in thermally troublesome areas of the chip to maximize the time that a core or device can operate before reaching its thermal threshold.

As shown schematically in FIG. 1.1A, for dynamically operated micro architectures, increasing the thermal capacitance of a device can significantly decrease the frequency of core hopping, gating, or throttling events. This in turn reduces the parasitic computational overhead associated with the DCM implementation. Thus, matching a device's thermal capacitance to its intrinsic dynamics of power dissipation can "homogenize" the thermal time scales of devices with very different power dissipation profiles.

In order to locally alter the dynamic thermal properties of the devices, a portion of the silicon on the inactive back side of the chips can be etched away and a material with a higher thermal capacitance, for example phase change materials (PCMs), can be placed in the cavity created by removal of silicon (FIG. 2.2). The PCMs, named because of their ability to reversibly melt/solidify during heating/cooling processes, can absorb a large amount of thermal energy at a relatively constant temperature. One challenge of utilizing PCMs is that their typically low thermal conductivities ($\kappa$) limit the amount of material that can be melted prior to the device reaching its threshold temperature. This can be mitigated by using a "composite thermal capacitor" (CTC), consisting of PCM incorporated into a high thermal conductivity matrix to enhance heat spreading and therefore improve PCM utilization.

While the addition of phase change materials may extend the operating times of dynamically operated devices, some portion of each duty cycle where the device is idled or throttled will inevitably need to be allocated to allow the device to cool before beginning the next cycle. Because the CTC stores a tremendous amount of energy during the melting process, a system with CTC enhancements alone may have relatively long intrinsic cool-down times. Recognizing this potential drawback, a thoughtfully designed thermal solution must be designed with a means to rapidly regenerate the CTC, maximizing the device's availability, and thus overall performance (FIG. 2.1B).

Solid-state coolers (SSC's), such as thin film thermoelectric or superlattice coolers, are attractive candidates for PCM regeneration, as they are capable of moving very large heat fluxes, as long as minimal sub-cooling is required [16]. In 3D architectures, an added benefit of SSC's comes from the ability to establish physical separation between the cooled and heated junctions through careful placement of the anode and cathode [17]. Thus the cooled anode can be located within the 3D stack near the CTC to assist in the regeneration of the CTC, while the heated cathode can be placed closer to the external heat sink where it can more readily reject the generated heat to the ambient. Because of the nature of the melting and solidification process, little sub-cooling is required to regenerate the CTC, so that the SSC instead acts as a sort of thermal fast lane, increasing the rate at which the thermal energy from the CTC travels to the heat sink over spreading and conduction through the stack alone.

While there is certainly application space for the significant research into using SSCs as standalone hotspot cooling devices, for example [16-18]. The standalone SSC's heat dissipation capacity is highly dependent on the hotspot size [16], and it must have a cold junction in very close physical proximity to the heat source to be effective [18]. The CTC relaxes those constraints, because it is the CTC that is in close contact with the hotspot directly absorbing the heat load, and the SSC acts only as a secondary thermal transport enhancer with no direct effect on the maximum temperatures the device experiences. Furthermore, because the SSC only operates during the regeneration portion of the operating cycle, the power consumption of the SSC is less of a concern than if it were operating continually as a primary cooling device.

Method

2D Model-CTC Limiting Performance

To evaluate the potential of this approach we have modeled the performance of a CTC that uses an azimuthal array of diamond shaped loops of either Cu or CVD diamond as a heat spreader matrix (FIG. 2.4). The voids between the loops are filled with a PCM with properties of a Bi—In—Sn alloy with a 60° C. melting temperature. To simulate the process of activating a high power core and storing the energy in the PCM the heat equation is solved within a planar (thickness-averaged) CTC computational domain with the dimensions shown in FIG. 2.4. The impact of the melting of the PCM is accounted for by incorporating a modified enthalpy term in the heat equation, $\partial(\rho H)/\partial t = \nabla \cdot (K \nabla T) + \dot{E}_g$, as described in [19]. The source term $\dot{E}_g$, accounts for the heat generation at the hotspot, assumed to be uniformly distributed in the vertical (across the CTC layer) direction. In practice, the heat generation only occurs in a thin layer on the active side of the chip, so this approximation is only valid in the limit of thin PCM layers with high effective thermal conductivity across the plane, such that temperature gradients in the vertical direction are negligible.

The outer boundaries of the computational domain are considered adiabatic, and the heat generation in the hotspot domain is taken as 33 W/mm³ corresponding to a 500 W/cm² hotspot under a 150 μm thick CTC, in line with projected peak heat fluxes in future devices [10]. The size of the regular octagonal domain is set at a 3 mm circumdiameter to ensure that the CTC does not monopolize an impractical amount of valuable real estate in the bulk Si, which is also needed for through-layer interconnect routing [20]. For each configuration analyzed, the chips starts at an initially uniform temperature of 59° C. and the simulations are run until the junction temperature reaches 90° C.

Because of the major assumptions included in this model, including complete isolation from any external heat sink, neglecting temperature gradients in the vertical direction, and large allowable temperature swings (up to 30° C.), this initial analysis should give a good picture of what best case potential operating time enhancements can be achieved with the CTC design.

3D Model-CTC Integrated into a 3 Layer Stack with SSC Regeneration.

After considering the potential of various PCM-high k spreader configurations in the 2D domain, a fully three-dimensional model, shown in FIG. 2.3, was built to investigate how the CTC with SSC regeneration would perform when packaged in a configuration similar to what would be experienced in an actual multi-layer stack. The computational domain consists of three 1.5 cm×1.5 cm×150 μm silicon tiers with a 20 μm thick polymer between each layer, as a bonding agent. In each 20 μm polymer layer a 5×10¹⁰ W/m³ source term is applied, to simulate the 100 W/cm² background heat flux of the layer. At the bottom surface of the lowest layer, a 100 W/cm² background heat flux is applied as well, except for a 1 mm×1 mm square area at the center where the hotspot is simulated. The hotspot is taken to have a heat flux (either 500 W/cm² or 1 W/cm²) applied until the temperature rises by 11° C., when the boundary condition is changed to adiabatic, to simulate completely shutting the core down during the cool down portion of the cycle.

Directly above the hotspot, a 3 mm×3 mm portion of the silicon in the bottom silicon tier has been replaced with a CTC with the estimated properties of a Bi—In—Sn alloy with 79° C. melting temperature (alloy-174), with an enhanced effective thermal conductivity ranging from 40-120 W/m–K by embedding the high thermal conductivity matrix (e.g., copper or diamond). Above the CTC is a 3 μm thick SSC with the properties of SiGe which can optionally be activated to enhance the regeneration during the cool down portion of the cycle. To simulate the SSC operation, additional source terms are included into a heat transfer model of the device. Some source terms model the Peltier effect at the anode metal-SiGe, SiGe-silicon, and silicon-cathode metal interfaces according to: $\dot{E}_g = I(S_i - S_j)T$ [16], where I is the supply current to the device, $S_i$ is the Seebeck coefficient of the $i^{th}$ material (i.e. metal, SiGe, etc), and T is the temperature of the interface. The other source terms account for Joule heating in the SSC, silicon substrate, and the vertical silicon via that electrically connects the substrate to the cathode at the top (heat sink adjacent) layer. Joule heating is computed from $\dot{E}_{g\text{-}joule} = I^2 R$, where the resistance R is the sum of the one-dimensional conduction resistance $R_{1D} = t/\sigma A$, the electrical spreading resistance $R_{spr} = 8/3\pi^2 \sigma r$ and an Ohmic contact resistance of $10^{-6}$ Ωcm² [21]. In these expressions, t is the thickness of the layer, s is the electrical conductivity of the material, A is the cross sectional area of the layer, and r is the effective radius of the contact area where spreading occurs.

At the top of the third layer a convective boundary condition is applied with an ambient temperature of 27° C. (300 K) and an effective heat transfer coefficient of 87,000, which is equivalent to a heat sink with a thermal resistance of 0.05 K/W.

Alternate Configurations

As described in the Discussion section an alternate embodiment of the device can have the CTC physically separated from the electronic device containing the hotspot, with thermal communication established via a thermally conductive slab or via or through conduction through additional intermediate heat transfer devices. An example of this type of configuration is shown in FIG. 2.4. Here the electronic device containing the hotspot is embedded in a 3D stack with fluidic channels in between each layer to remove the background heat fluxes from the devices. The hotspot in the bottom layer of the stack cannot be adequately cooled by the background cooling, so a CTC is needed to bring its thermal time response in line with the rest of the devices in the stack.

In this configuration the CTC is placed several layers above the hotspot to allow for the placement of the fluidic channels in the intermediate layers. Thermal communication is established using copper though silicon vias (TSV's) as well as through conduction through the silicon from the vertically adjacent electronic devices.

As was done in the previous 3D modeling discussed above CTC implementations of varying thermal conductivity were considered to determine their effectiveness in increasing the device's availability. The effective of changing the method of active regeneration scheme was also considered here. In addition to the use of a solid state cooler, the effects of using varying types of fluidic cooling were considered. The effects of increasing the heat transfer coefficient of the fluidic cooling scheme from 22 kW/m²-K to 100 kW/m²-K (baseline vs. enhanced rate regeneration) were considered. In addition the effects on the regeneration rate of sub cooling the coolant 10 K from 310 K to 300 K were considered.

Experimental Characterization

A prototype including a hotspot heater and silicon CTC device has been fabricated and characterized to validate the potential of the CTC concept for enhancing device operating times. The 1 mm×1 mm square hotspot heater, shown in FIG. 2.5, was fabricated on a Pyrex wafer to minimize spreading in the substrate, instead concentrating heating in the vicinity CTC under investigation. The prototype CTC was fabricated by etching diamond shaped troughs in a 190 µm thick Si wafer that was coated with a 1 µm thick layer of Pt with Ti adhesion layer to improve wetting of the Si spreader by the PCM. The troughs were filled with alloy 136, a eutectic alloy of 49% Bi, 21% In, 18% Pb, 12% Sn with a 58° C. melting temperature.

The CTC was attached to the hotspot using a Ceramique, spreadable thermal interface material (TIM) and the entire device was then preheated in a 53° C. oven to simulate the hot conditions that might be experienced inside of a 3D stack. The hotspots were then activated for short pulses of either 100 ms at ~133 W/cm² or 30 ms at ~45 W/cm².

Results

As shown in FIG. 2.4, there is a significant potential for extending the core operating time before throttling/hopping is required with the use of CTC. When compared with the baseline case of pure Si heat spreading through the device stack, which allows the core to operate for about 3 ms before reaching the threshold temperature, an increase in operating time ranging from a factor of 10× for the copper-based matrix up to over 20× for the diamond-based matrix can be achieved.

Two separate peaks are seen in FIG. 2.10. The first local maximum occurs in the regime where the PCM fraction is above 90% and the performance is limited by the tradeoff between the increased spreading that is achieved with adding additional high κ materials and the associated decrease in the amount of PCM available for heat storage. With higher κ materials such as diamond, CNTs or graphene, an appreciable increase in spreading can be achieved with the addition of a relatively small amount of the higher κ material, so that the capacitive properties of the composite still closely resemble that of the unaltered PCM. However, with more moderate κ spreading materials such as copper or silicon, the increase in spreading at very high PCM loading is small, diminishing the magnitude of the first peak.

In the second maximum, which occurs at PCM loadings below 60%, the performance is limited primarily by the amount of lateral cross sectional area allotted to the CTC. In this regime, additional spreading could potentially be achieved by adding extra high κ materials, but the area that is made available for the placement of the CTC is limited to 3 mm in diameter by the electrical design and routing constraints discussed above. While the performance of both regimes is governed by the combination of the energy storage due to phase change at the melt front and single phase heating of the composite material in the regions where melting has already occurred, in this lower PCM loading regime the single phase portion of the capacitance is strongly affected by the presence of the higher κ materials.

In practice, in an actual device the entire 3 mm diameter may not be required, as replacing the Si with the CTC only makes sense in the regions where melting occurs before reaching the threshold temperature. The presence of the extra CTC materials in the simulations where they were ultimately not needed does affect the accuracy of the results however, because the regions beyond the melt front remain effectively adiabatic throughout the transient.

The results of the 3D simulations (FIG. 2.11) show that the potential of the CTC to maximize device operating times when packaged into a realistic device remain significant. For the configuration considered, operating time enhancements of over 4× can be achieved at 500 W/cm², and over 10× is possible at 1 kW/cm². Notably, at 1 kW/cm² the operating time is increased from 0.7 ms up to 7.5 ms, which would bring the hottest cores in line with the time constant of the rest of the chip [9], significantly simplifying the task scheduling process.

When relying on spreading in the bulk alone for regenerating the PCM, the device's overall availability becomes low, which could be problematic if there is not sufficient device redundancy on the chip. The implementation of active SSC regeneration significantly decreases the unavailability problem, reducing device idle time requirements by 2×-3×. While the SSC regeneration significantly improves performance of CTC, overall availability of the core with CTC still trails the unaltered Si values for this configuration.

In the alternate configuration an over 100 ms increase in amount of time that the hotspot device can operate before requiring a throttling event can be achieved with the use of a CTC with an effective thermal conductivity of 150 W/m-K, shown in FIG. 2.6. Regarding the regeneration schemes, FIG. 2.7 shows that increases in overall utilization of up to 38% can be achieved depending on the regeneration scheme. The results for each case are summarized in FIG. 2.8. Sub cooling provides an additional 4.5% cooling over the baseline fluidic regeneration, while enhancing the regeneration rate or using a solid state cooler can provide much larger increases in overall device utilization.

As seen in FIG. 2.9, the experimental results show that in each case some improvement of the thermal response of the hotspot was observed when the CTC was placed on top of the heater when compared to the response observed when the CTC was replaced with an unaltered piece of 190 μm thick Si. For example, in the 45 W/cm$^2$ case, increases in operating time before throttling in the range of ~4.5x-6x can be achieved for allowable temperature fluctuations of <10° C. In the 133 W/cm$^2$ case if an 85° C. maximum allowable junction temperature throttle criteria is applied an increase in operating time of ~4.4x can be achieved.

CONCLUSION

We have introduced a new thermal management approach based on an imbedded CTC network that can be applied to dynamically operated microprocessors experiencing non-uniformities in their power profiles due to asymmetric architectures or integration of heterogeneous devices. It has been shown that with careful design this approach can have a dramatic impact on core hopping and throttling frequencies, resulting in devices with greater spatial and temporal synchronization. One of the most important advantages of the approach is that it is locally passive, requiring no additional fluidic routing to realize its benefits.

The addition of SSC regeneration dramatically increases the system availability over what can be achieved with the CTC alone, although still falling short of the availability that would be seen with the unaltered silicon substrate. Further optimization of the SSC parameters and properties could close this gap however, as well as consideration of non-idealities such as anisotropy in the interface layer thermal conductivities, smaller allowable temperature swings and less aggressive heat sink thermal resistances. Even with the current configuration, the proposed solution allows the chip designer to consider these tradeoffs of significantly reduced throttling frequency against a small loss in overall availability to produce a system that most closely meets the specific performance requirements for a given application.

REFERENCES

Each of which is Included Herein by Reference

[1] D. A. Patterson, "Latency lags bandwith," *Communications of the ACM*, vol. 47, no. 10, pp. 71-75, 2004.
[2] L. B. Kish, "End of Moore's law: thermal (noise) death of integration in micro and nano electronics," *Physics Letters A, vol.* 305, no. 3-4, pp. 144-149, 2002.
[3] S. Borkar, "Thousand core chips: a technology perspective." p. 749.
[4] P. Emma, and E. Kursun, "'Is 3D Chip Technology the Next Growth Engine for Performance Improvement?," *IBM J. Res. & Dev*, vol. 52, pp. 541-552.
[5] M. D. Hill, and M. R. Marty, "Amdahl's law in the multicore era," *Computer*, vol. 41, no. 7, pp. 33-38, 2008.
[6] A. W. Topol, D. C. La Tulipe Jr, L. Shi et al., "Three-dimensional integrated circuits," *IBM Journal of Research and Development*, vol. 50, no. 4-5, pp. 491-506, 2006.
[7] R. Yavatkar, and M. Tirumala, "Platform wide innovations to overcome thermal challenges," *Microelectronics Journal*, vol. 39, no. 7, pp. 930-941, 2008.
[8] W. Huang, K. Skadron, S. Gurumurthi et al., "Exploring the Thermal Impact on Manycore Processor Performance," in 26th IEEE SEMI-THERM Symposium, 2010.
[9] Z. Xiuyi, Y. Jun, X. Yi et al., "Thermal-Aware Task Scheduling for 3D Multicore Processors," *Parallel and Distributed Systems, IEEE Transactions on*, vol. 21, no. 1, pp. 60-71, 2009.
[10] Y. J. Kim, Y. K. Joshi, A. G. Fedorov et al., "Thermal Characterization of Interlayer Microfluidic Cooling of Three-Dimensional Integrated Circuits With Nonuniform Heat Flux," *Journal of Heat Transfer*, vol. 132, no. 4, pp. 0410091-0410099, 2010.
[11] A. Bar-Cohen, M. Arik, and M. Ohadi, "Direct liquid cooling of high flux micro and nano electronic components," *Proceedings of the IEEE, vol.* 94, no. 8, pp. 1549-1570, 2006.
[12] C. Green, A. G. Fedorov, and Y. K. Joshi, "Fluid-to-Fluid Spot-to-Spreader (F2/S2) Hybrid Heat Sink for Integrated Chip-Level and Hot Spot-Level Thermal Management," *Journal of Electronic Packaging*, vol. 131, pp. 025002, 2009.
[13] S. Narayanan, A. G. Fedorov, and Y. K. Joshi, "Gas-Assisted Thin-Film Evaporation from Confined Spaces for Dissipation of High Heat Fluxes," *Nanoscale and Microscale Thermophysical Engineering*, vol. 13, no. 1, pp. 30-53, 2009.
[14] P. Chaparro, J. González, G. Magklis et al., "Understanding the Thermal Implications of Multicore Architectures," *IEEE TRANSACTIONS ON PARALLEL AND DISTRIBUTED SYSTEMS*, pp. 1055-1065, 2007.
[15] "Failure Mechanisms and Models for Semiconductor Devices," JEP122E JEDEC Solid State Technology Association, 2009.
[16] A. Shakouri, "Nanoscale thermal transport and microrefrigerators on a chip," *Proceedings of the IEEE*, vol. 94, no. 8, pp. 1613-1638, 2006.
[17] V. Sahu, Y. K. Joshi, and A. G. Fedorov, "Experimental investigation of hotspot removal using superlattice cooler."
[18] A. Bar-Cohen, and P. Wang, "On-chip Hot Spot Remediation with Miniaturized Thermoelectric Coolers," *Microgravity Science and Technology*, vol. 21, pp. 351-359, 2009.
[19] "FLUENT 6.3 User's Guide," Fluent Inc., 2006.
[20] M. B. Healy, H. H. S. Lee, G. H. Loh et al., "Thermal optimization in multi-granularity multi-core floorplanning." pp. 43-48.
[21] Y. Ezzahri, G. Zeng, K. Fukutani et al., "A comparison of thin film microrefrigerators based on Si/SiGe superlattice and bulk SiGe," *Microelectronics Journal*, vol. 39, no. 7, pp. 981-991, 2008.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to about 'y'" includes "about 'x' to about 'y'".

Many variations and modifications may be made to the above-described embodiments. All such modifications and variations are intended to be included herein within the scope of this disclosure and protected by the following claims.

Therefore, the following is claimed:

1. A device, comprising:
   an electronic device having at least one hot spot, and
   a composite thermal capacitor disposed in thermal communication with the hot spot of the electronic device, wherein the composite thermal capacitor includes a phase change material, wherein the heat from the hot spot is stored by the phase change material.

2. The device of claim 1, wherein the phase change material is selected from the group consisting of: solid-to-solid, a solid-to-liquid, a solid-to-gas, and a liquid-to-gas, phase change material.

3. The device of claim 1, wherein the composite thermal capacitor includes the phase change material imbedded into a matrix of a high thermal conductivity material.

4. The device of claim 3, wherein the high thermal conductivity material is selected from the group consisting of: copper, silver, gold, aluminum, graphitzed carbon, silicon, carbon nanotubes, diamond, graphene, and a combination thereof.

5. The device of claim 3, wherein the ratio of the phase change material to the high thermal conductivity material is about 1:100 to 1:1.

6. The device of claim 1, wherein the electronic device is selected from the group consisting of: a two-dimensional semiconductor chip stack, a three-dimensional semiconductor chip stack, a multi-core semiconductor chip, a memory device, Application Specific Integrated Circuits (ASICs), System-on-a-Chip (SoC), a microelectronic chip, a optoelectronic chip, a hybrid optoelectronic/microelectronic chip, a memory device, analog or radio frequency (RF) micro devices, System on a Package (SOP), biochips, medical or electronic imaging devices, and on chip power management devices.

7. The device of claim 1, wherein the composite thermal capacitor is in thermal communication with the hot spot of the electronic device using a structure selected from the group consisting of: one or more through-silica vias, a high conductivity slab, a heat pipe, a fluidic loop, a solid state heat pump, an intermediate electronic device, and a combination thereof.

8. The device of claim 1, further comprising an active regeneration cooling device in thermal communication with the composite thermal capacitor, wherein the heat from the composite thermal capacitor is dissipated by the active regeneration cooling device.

9. The device of claim 8, wherein the active regeneration cooling device is selected from the group consisting of: solid state cooling device, a fluidic cooling device, a heat pipe, and a combination thereof.

10. The device of claim 8, further comprising an external heat sink in thermal communication with the active regeneration device.

11. The device of claim 3, wherein the composite thermal capacitor has a first area and a second area, wherein the first area includes the phase change material and the second area includes the high thermal conductivity material, wherein the first area can include one or more portions, wherein each portion has the second area as a boundary, and the first area and second area are in thermal communication between each other.

12. The device of claim 11, wherein each portion of the first area has a cross-section selected from the group consisting of: a polygonal cross-section, a circular cross-section, substantially circular cross-section, annular cross section, and a combination thereof.

13. The device of claim 12, wherein each portion has an outer boundary defined by the second area.

* * * * *